United States Patent
Pozsgay et al.

(10) Patent No.: US 8,165,549 B2
(45) Date of Patent: *Apr. 24, 2012

(54) METHOD FOR NOTCH FILTERING A DIGITAL SIGNAL, AND CORRESPONDING ELECTRONIC DEVICE

(75) Inventors: Andras Pozsgay, Contamine sur Arve (FR); Frédéric Paillardet, Aix les Bains (FR)

(73) Assignees: STMicroelectronics N.V., Amsterdam (NL); STMicroelectronics SA, Montrouge (FR)

( * ) Notice: Subject to any disclaimer, the term of this patent is extended or adjusted under 35 U.S.C. 154(b) by 786 days.

This patent is subject to a terminal disclaimer.

(21) Appl. No.: 12/208,921

(22) Filed: Sep. 11, 2008

(65) Prior Publication Data

US 2009/0082006 A1 Mar. 26, 2009

(30) Foreign Application Priority Data

Sep. 14, 2007 (EP) .................................... 07301367

(51) Int. Cl.
- *H04B 1/06* (2006.01)
- *H03M 1/66* (2006.01)
- *H04L 27/00* (2006.01)

(52) U.S. Cl. ...................... 455/243.1; 341/144; 375/295

(58) Field of Classification Search .................. 341/110, 341/117, 144, 143, 120; 455/74, 553.1, 73, 455/75, 86, 131, 88, 550.1, 139, 157.1, 158.2, 455/164.1, 232.1, 241.1, 243.1; 375/327, 375/295

See application file for complete search history.

(56) References Cited

U.S. PATENT DOCUMENTS

| | | | |
|---|---|---|---|
| 7,483,483 B2 * | 1/2009 | Lakkis | 375/238 |
| 7,755,521 B1 * | 7/2010 | Kuramochi et al. | 341/118 |
| 7,860,189 B2 * | 12/2010 | Petilli et al. | 375/316 |
| 7,903,015 B1 * | 3/2011 | Hezar et al. | 341/152 |
| 2003/0001764 A1 * | 1/2003 | Ruha et al. | 341/144 |

(Continued)

FOREIGN PATENT DOCUMENTS

WO 96/15585 5/1996

(Continued)

OTHER PUBLICATIONS

Eloranta et al.,"Direct-Digital RF Modulator IC in 0.13μm CMOS for Wide-Band Multi-Radio Applications", ISSCC 2005, Session 29, RF Techniques, 29.2, Feb. 9, 2005, pp. 532-533, 615.

(Continued)

*Primary Examiner* — Andrew Wendell
*Assistant Examiner* — Cindy Trandai
(74) *Attorney, Agent, or Firm* — Allen, Dyer, Doppelt, Milbrath & Gilchrist, P.A.

(57) ABSTRACT

An electronic device, includes sigma-delta modulation circuit to operate with a clock signal and having output circuitry to deliver a digital data signal. First circuitry delivers a radiofrequency transposition signal. A notch filter includes radiofrequency digital-to-analog conversion blocks, having first input circuitry coupled to the output circuitry. Second input circuitry receives the radiofrequency transposition signal. Second output circuitry delivers a radiofrequency analog signal. Digital delay circuitry is controlled by the clock signal and includes a delay block between the two first input circuits. The frequency of a notch of the notch filter is related to the value of the delay from the delay block. Summation circuitry sums the radiofrequency signals.

13 Claims, 8 Drawing Sheets

U.S. PATENT DOCUMENTS

| | | | |
|---|---|---|---|
| 2003/0202537 A1* | 10/2003 | Rogerson et al. | 370/478 |
| 2004/0036636 A1* | 2/2004 | Mai et al. | 341/131 |
| 2004/0201428 A1* | 10/2004 | Kenney et al. | 331/16 |
| 2005/0057384 A1* | 3/2005 | Chen et al. | 341/143 |
| 2005/0068213 A1* | 3/2005 | Fontaine et al. | 341/143 |
| 2005/0122241 A1* | 6/2005 | Magrath | 341/76 |
| 2006/0022857 A1* | 2/2006 | Chen | 341/144 |
| 2006/0164273 A1 | 7/2006 | Hickling | 341/143 |
| 2007/0236376 A1* | 10/2007 | Kozak et al. | 341/143 |
| 2007/0241950 A1* | 10/2007 | Petilli et al. | 341/143 |
| 2008/0042746 A1* | 2/2008 | Kozak et al. | 330/251 |
| 2008/0309529 A1* | 12/2008 | Sandler et al. | 341/120 |
| 2009/0073013 A1* | 3/2009 | Pozsgay et al. | 341/144 |

FOREIGN PATENT DOCUMENTS

| | | |
|---|---|---|
| WO | 2005/015752 | 2/2005 |
| WO | 2005/015753 | 2/2005 |
| WO | 2006/117590 | 11/2006 |

OTHER PUBLICATIONS

Rode, J. et al, "Transmitter Architecture Using Digital Generation of RF Signals", Radio and Wireless Conference, 2003. Rawcon '03. Proceedings Aug. 10-13, 2003, Piscataway, NJ, USA, IEEE, Aug. 10, 2003, pp. 245-248.

Ribner D.B: "Multistage Bandpass Delta Sigma Modulators", IEEE Transactions on Circuits and Systems II, Express Briefs, IEEE Service Center, New York, NY, US, vol. 41, No. 6, Jun. 1, 1994, pp. 402-405.

Taleie, S.M. et al. "A Bandpass Delta Sigma RF-DAC with embedded FIR Reconstruction Filter", Solid-State Circuits, 2006, IEEE International Conference Digest of Technical Papers, Feb. 6-9, 2006, Piscataway, NJ, USA, pp. 2370-2379.

Luschas et al., "Radio Frequency Digital-to-Analog Converter", IEEE Journal of Solid-State Circuits, vol. 39, No. 9, Sep. 2004, pp. 1462-1467.

* cited by examiner

METHOD FOR NOTCH FILTERING A DIGITAL SIGNAL, AND CORRESPONDING ELECTRONIC DEVICE

FIELD OF THE INVENTION

The invention relates to the processing of digital signals, in particular the notch filtering of such signals delivered by sigma-delta modulation in order to reduce the quantization noise in certain frequency bands.

A non-limiting application of the invention is directed to a wireless apparatus, in particular cellular mobile phones, operating with two or more radio systems simultaneously, for example one connectivity system like WiFi or WiMAX, and one cellular system in the DCS, PCS or W-CDMA bands.

BACKGROUND OF THE INVENTION

Generally speaking, the transmission chain of a wireless apparatus, like a mobile phone, comprises a digital stage and an analog front-end-module coupled to an antenna. The digital stage and the front-end module are mutually coupled through a digital to analog conversion stage.

In order to reduce the number of bits in the digital to analog conversion stage, a high frequency sigma-delta modulator is used.

Due to the very high clock rate of the clock signal with which the sigma-delta modulator operates, the quantization noise is pushed far away from the emission band. However, in a mobile phone, this kind of noise is polluting the cellular receive bands like the DCS, PCS, or W-CDMA bands. Thus, a great amount of filtering (70-80 dB) may be helpful in the transmitting chain.

A first conventional approach includes using a high-order single loop multi-bit digital sigma-delta modulator. The high-order structure allows the placement of the notches in the noise transfer function of the modulator. The notch frequencies are defined by coefficients in the feedback path of the modulator. A drawback of this approach is that the coefficients are implemented by multipliers that may perform the multiplication in a fraction of the sampling clock period. This leads to a limitation of the clock frequency and, in practice, the highest achievable clock frequency is in the range of 1 GHz when using conventional silicon technologies, like 65 nanometers CMOS. This limitation means that, to achieve an acceptable noise shaping, a quite high order modulator is needed. For example, a W-CDMA transmitter architecture needs two 9th order 4-bit modulators to suppress the quantization noise in the W-CDMA Rx band, with an estimated power consumption of 150 mW, which may be too high for mobile applications.

Another conventional approach proposes a FIR filter that combines the output of a direct conversion transmitter with its delayed signals to achieve a bandpass filter. However, such an approach also suffers drawbacks.

For example, to achieve a bandpass filter with a relatively narrow band and good attenuation, a great number of FIR elements must be used, with coefficients that vary in a wide range, which may be hard to realize.

As a part of the coefficients may be negative to achieve good bandpass filter characteristics, a part of the radiofrequency power produced by the digital to analog converter may be cancelled, thus the efficiency is not optimal.

As the FIR filter is used after the RF modulators, the whole delay chain of the FIR filter may operate at least twice the carrier frequency.

SUMMARY OF THE INVENTION

According to an embodiment, a radiofrequency digital to analog converter (DAC) array is used to place notches in the DAC transfer function, thus reducing the quantization noise in critical frequency bands.

According to another embodiment, it is a much simpler sigma-delta modulator, e.g. one with cascaded first order stages, which can be realized at much higher clock frequencies without increasing too much the power consumption that may be used.

According to yet another aspect, an electronic device comprises sigma-delta modulation means or circuitry operating with a clock signal and having output means or circuitry adapted to deliver a digital data signal. Moreover, there is a first means or circuitry, for example a phaselooked loop (PLL), adapted to deliver a radiofrequency transposition signal, and a notch filter including at least two identical radiofrequency (RF) digital to analog conversion (DAC) blocks each having first input means or circuitry coupled to the output means or circuitry, second input means or circuitry adapted to receive the radiofrequency transposition signal, and second output means or circuitry adapted to deliver a radiofrequency analog signal. Digital delay means or circuitry controlled by the clock signal and includes a delay block coupled between the two first input means or circuitry, the frequency of a notch of the notch filter being related to the delay's value of the delay block, and summation means or circuitry adapted to sum the radiofrequency analog signals.

According to a further embodiment, the notch filter comprises N identical radiofrequency digital to analog conversion blocks, N being greater than or equal to 2, and the digital delay means or circuitry includes a chain of N−1 delay blocks respectively coupled between the N first input means or circuitry of the N digital to analog blocks.

In other words, instead of one RF DAC, several RF DACs are coupled to a chain of (at least one) delay blocks. The delay blocks operate with the clock used by sigma-delta modulation means or circuitry. Further, the digital to analog conversion means or circuitry may be identical, thus potentially easier to build. And, as the coefficients of the filter are positive, the useful signal amplitude is the sum of the DAC signal amplitudes. There is thus less signal power loss due to negative coefficients.

The positions of the notches of the notch filter, i.e. the frequencies of the notches are related to the delay values of the delay blocks. Thus, a notch filter is provided whereby the quantization noise in the desired frequency bands is reduced.

The ripple level of the output summed radiofrequency analog signal depends on the values of the delays. The man skilled in the art may be able to choose these delay values depending on the acceptable ripple level depending on the application.

However, an acceptable approach includes choosing the delay values of the delay means or circuitry, smaller than $1/(10*BW)$, and preferably smaller than $1/(30*BW)$, where BW is the frequency bandwidth of the summed radiofrequency analog signal.

Additional flexibility can be added by making the delays programmable. In this case, an advantageous position of the notches can be chosen as a function of, for example, the transmission carrier frequency, and the actual coexistence uses in the mobile phone. This flexibility reduces further the transmission filtering requirements.

The electronic device may be realized within an integrated circuit. According to another aspect, a wireless apparatus includes an electronic device, as defined above.

A method is for notch filtering a digital signal delivered by sigma-delta modulations means or circuitry operating with a clock signal. The method comprises delaying the digital signal using the clock signal for obtaining at least one delayed digital signal, the frequency of a notch of the notch filter being related to the delay's value. The digital signal and the delayed digital signal are processed by processing including a radiofrequency transposition and a digital to analog conversion for respectively obtaining radiofrequency analog signals, and summing the radiofrequency analog signals.

Delaying the digital signal comprises successively delaying the digital signal with several respective delays for obtaining at least two different delayed signals, and the method comprises processing the digital signal and the delayed signal with said processing, and summing all said radiofrequency analog signals. Each delay's value may be programmable.

BRIEF DESCRIPTION OF THE DRAWINGS

Other advantages and features of the Present approach will appear on examining the detailed description of embodiments, these being in no way limiting, and of the appended drawings in which.

DETAILED DESCRIPTION OF THE PREFERRED EMBODIMENTS

Figure 1:
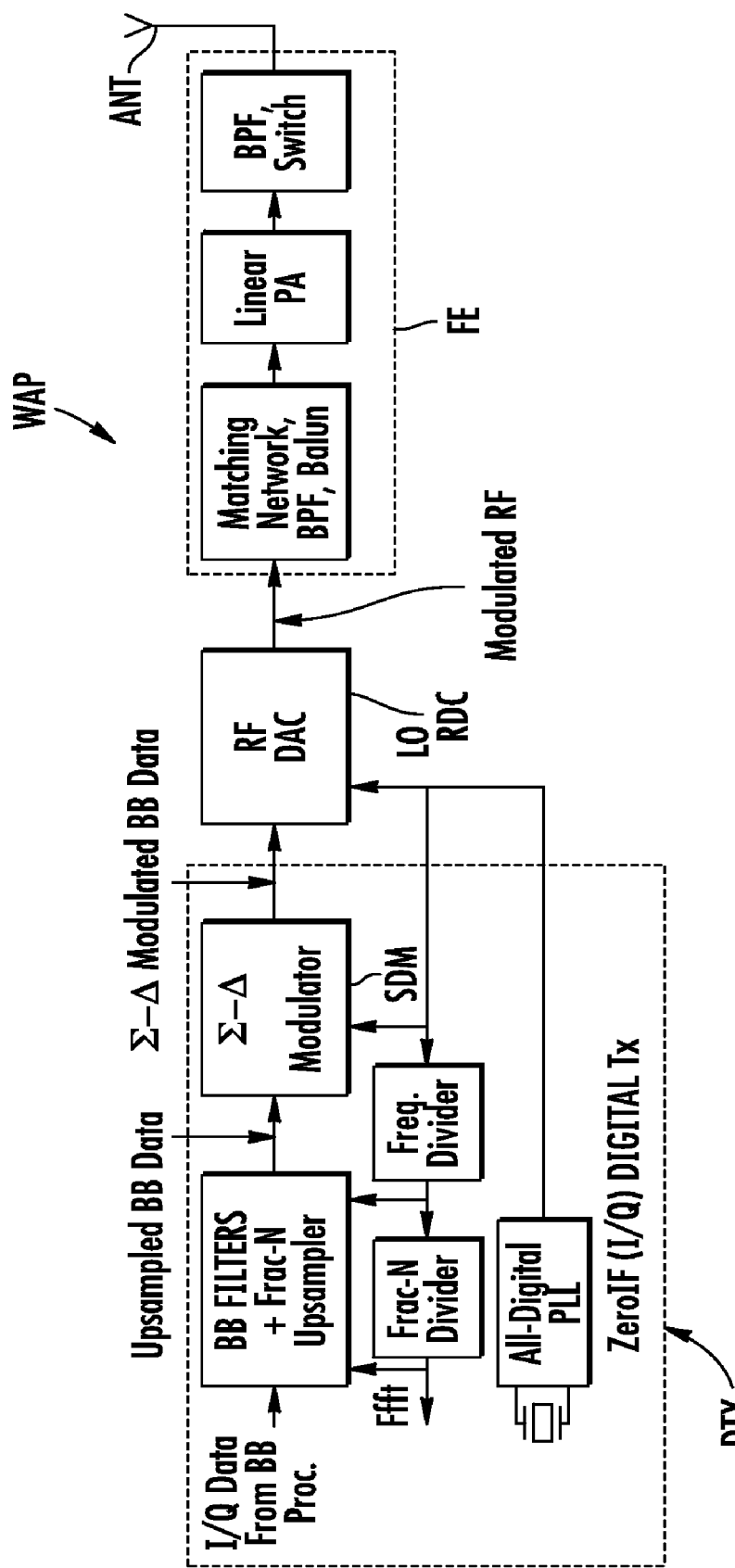
FIGS. 1 and 2 illustrate a prior art structure and an example of a corresponding shaped quantization noise.

FIG. 1 illustrates an example of a conventional transmission chain of a wireless apparatus WAP, such as a mobile phone. The transmission chain comprises a digital stage DTX connected through a single radiofrequency digital to analog converter RDC, to an analog front end stage FE. The front end stage FE is connected to an antenna ANT.

The digital stage DTX comprises low and high frequency digital logic, whose task is to change the sampling rate of the base-band (BB) signal delivered by a base-band processor, from Ffft (Base-Band Sampling Frequency, in the range of a few MHz) to Fc (Fcarrier) or a multiple of Fc, in the range of a few hundred MHz to a few GHz. This upsampled signal is then processed by a sigma-delta modulator (SDM) in order to represent the high resolution base-band signal using a reduced number of bits.

The front end stage comprises conventionally a matching network, bandpass filter (BPF), balun, as well as a linear power amplifier (PA) and other conventional elements. The block RDC performs both the radiofrequency transposition and the digital to analog conversion.

Such a block is well known by the man skilled in the art. For example, one can cite the article of Shahin Mehdizad Taleie et al.: a bandpass delta-sigma RF-DAC with Embedded FIR reconstruction filter (ISSCC 2006/session 31) very high speed ADC and DACs/31.7, the article of Petri Eloranta et al.: direct-digital RF modulator IC in 0.13 µm, CMOS for wideband multi-radio applications, ISSCC 2005/session 29/RF Techniques/29.2, the article of Rode et. al.: Transmitter Architecture Using Digital Generation of RF Signals: 2003 IEEE, and the international patent application WO 2005 01 57 52.

Figure 2:
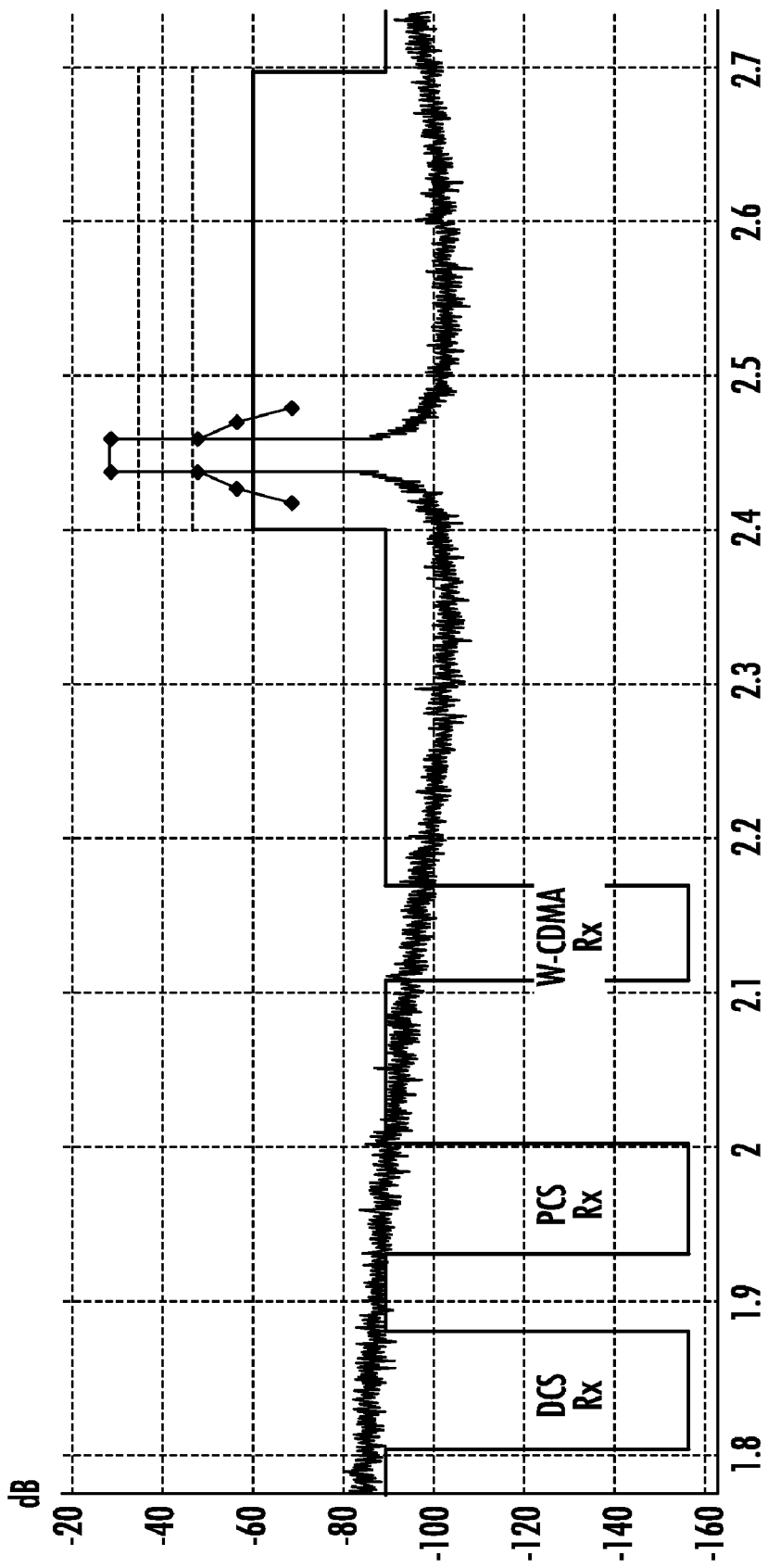

A practical implementation of the structure of FIG. 1 gives a shape quantization noise depicted in FIG. 2. This result has been obtained with a Wi-Fi OFDM signal in the 2.4 GHz band, with a carrier frequency Fc equal to 2.45 GHz, The sigma-delta modulator operates with a clock frequency Fsdm equal to twice the carrier frequency, i.e. 4.9 GHz. Due to the very high clock rate, the quantization noise is pushed far away from the emission band. However, in a mobile phone for example, this kind of noise is polluting the cellular received (Rx) band like the DCS, PCS or W-CDMA bands as illustrated in FIG. 2. Thus, a great amount of filtering (70-80 dB) is necessary in the transmitting chain.

Figure 3:
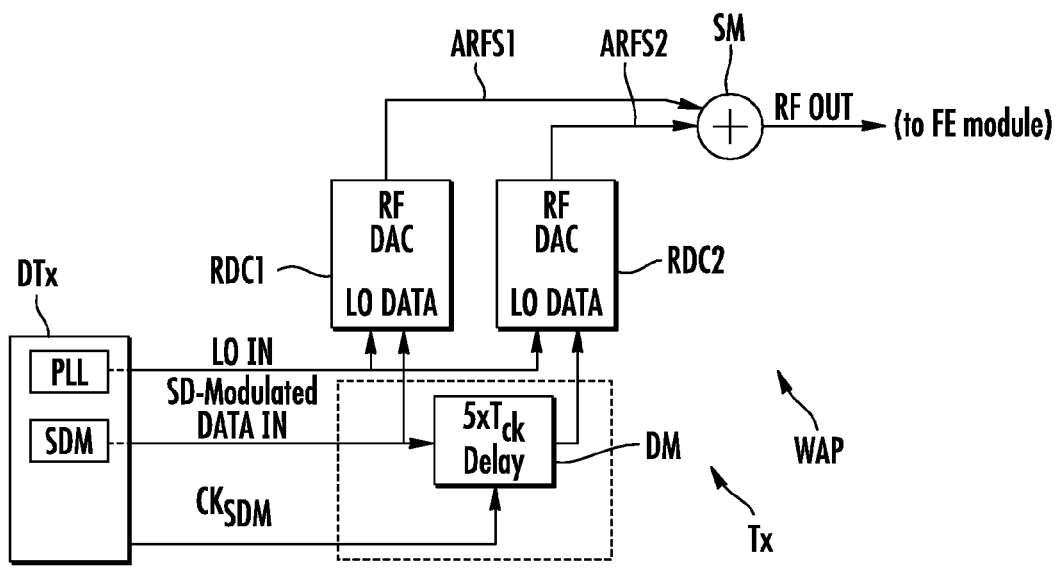
FIG. 3 illustrates an example of a device, according to the present invention.

The examples illustrated in FIG. 3 and following will realize a notch filter allowing the placement of the notches around the desired band (for example the DCS, PCS or W-CDMA receive bands), in order to reduce the filtering requirements.

The example illustrated in FIG. 3 comprises in the transmitting chain Tx of the wireless apparatus WAP, instead of one RF DAC, two RF DACs RDC1 and RDC2, both receiving the radiofrequency transposition signal LO IN at their LO input. This LO IN transposition signal may be delivered by a Phase Looked loop PLL in the digital stage DTx. A delay block DM is coupled between the two data inputs of the RF DACs RDC1 and RDC2.

This delay block DM is clocked by the clock signal $CK_{sdm}$ with which the sigma-delta modulator is operated. The value of the delay is a multiple of the clock period $T_{ck}$ of the clock signal $CK_{sdm}$. In the present case, the value of the multiple is equal to 5.

Whereas the data input of the first RF DAC RDC1 is directly coupled to the output of the sigma-delta modulator SDM, the data input of the second RF DAC RDC2 is coupled to the output of the sigma-delta-modulator SDM through the delay block DM. The two RF DACs RDC1 and RDC2 respectively deliver two radiofrequency analog signals ARFS1 and ARFS2, which are summed in summation means or circuitry SM in order to deliver a summed analog signal RF OUT which is delivered to the front end module FE.

Figure 4:
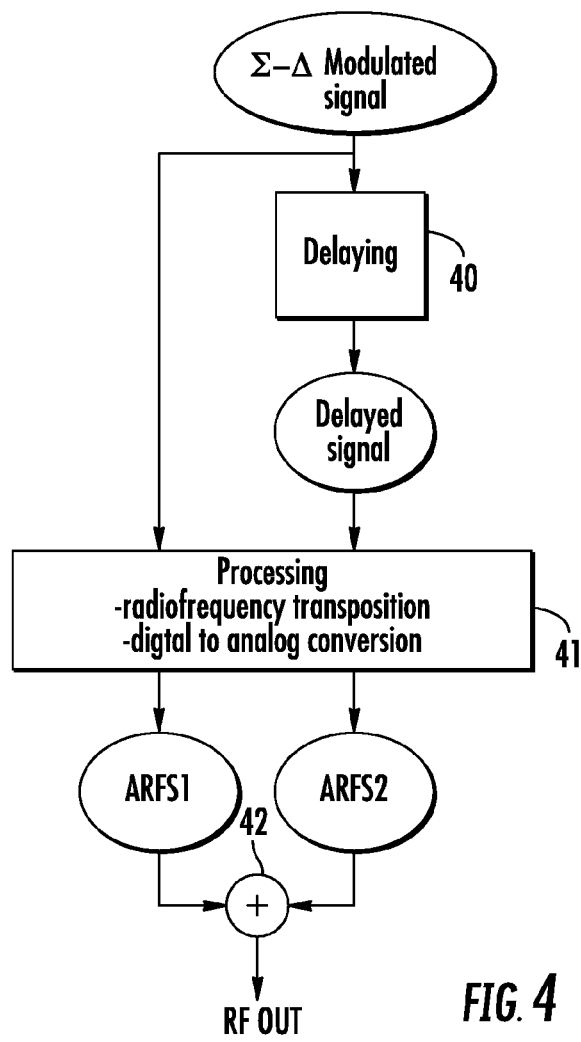
FIG. 4 illustrates diagrammatically a flow chart corresponding to a method, according to the present invention.

The summation may be a summation in current or in voltage depending on the structure of the RF DACs. The operation of the device illustrated in FIG. 3 is depicted in FIG. 4.

The sigma-delta modulated signal is delayed (step 40) in the delay block DM and both the sigma-delta modulated signal and the delayed signal are processed in the two RF DACs blocks RDC1 and RDC2 (step 41). The processing is for both signals, and comprises a radiofrequency transposition using the transposition signal LO IN and a digital to analog conversion.

Practically, each RF DAC block may comprise a single block performing both the radiofrequency transposition and the digital to analog conversion. Another approach would include using two distinct elements in each RF-DAC block. One element performs the radiofrequency transmission, and the other element performs the digital to analog conversion. Further, the radiofrequency transposition may be performed before or after the digital to analog conversion.

Practically, an RF DAC clock may be used, for example those disclosed in the above mentioned publications. It is to be appreciated, that either RF DACs may be used. The frequency of the notch of the notch filter in the baseband is related to the delay's value of the delay block. More precisely, the frequency of the notch in the baseband is equal to $F_{ck}/2n$, where Fck designates the frequency of the clock signal CKsdm and n designates the value of the multiple used in the delay block. In the present case, n is equal to 5.

After frequency transposition to the carrier frequency Fc, the summed radiofrequency analog signal RF OUT (step 42) comprises two notches having respectively the frequencies $F_c-f0$ and $F_c+f0$, where f0 is the frequency of the notch in the baseband. In the present example, the circuit of FIG. 3 is designed to operate using, for example, an 802.11 g (Wi-Fi) baseband signal as input. The modulation is, for example, a 64 QAM OFDM. The carrier frequency is equal to 2.4 GHz and the Phase Locked Loop (PLL) and the high speed logic operates at a frequency equal to twice the carrier frequency, i.e. to 4.8 Hz.

Thus, after frequency transposition, the signal comprises two notches NTCH1 et NTCH2 (FIG. 5), respectively placed at 1.92 and 2.88 GHz. For the present application, the first notch NTCH1 is useful, as it is placed near the PCS received band. In order to avoid too much ripple in the radiofrequency analog output signal RF OUT, it is preferable that the notches are placed as for as possible from the carrier frequency.

Figure 5:
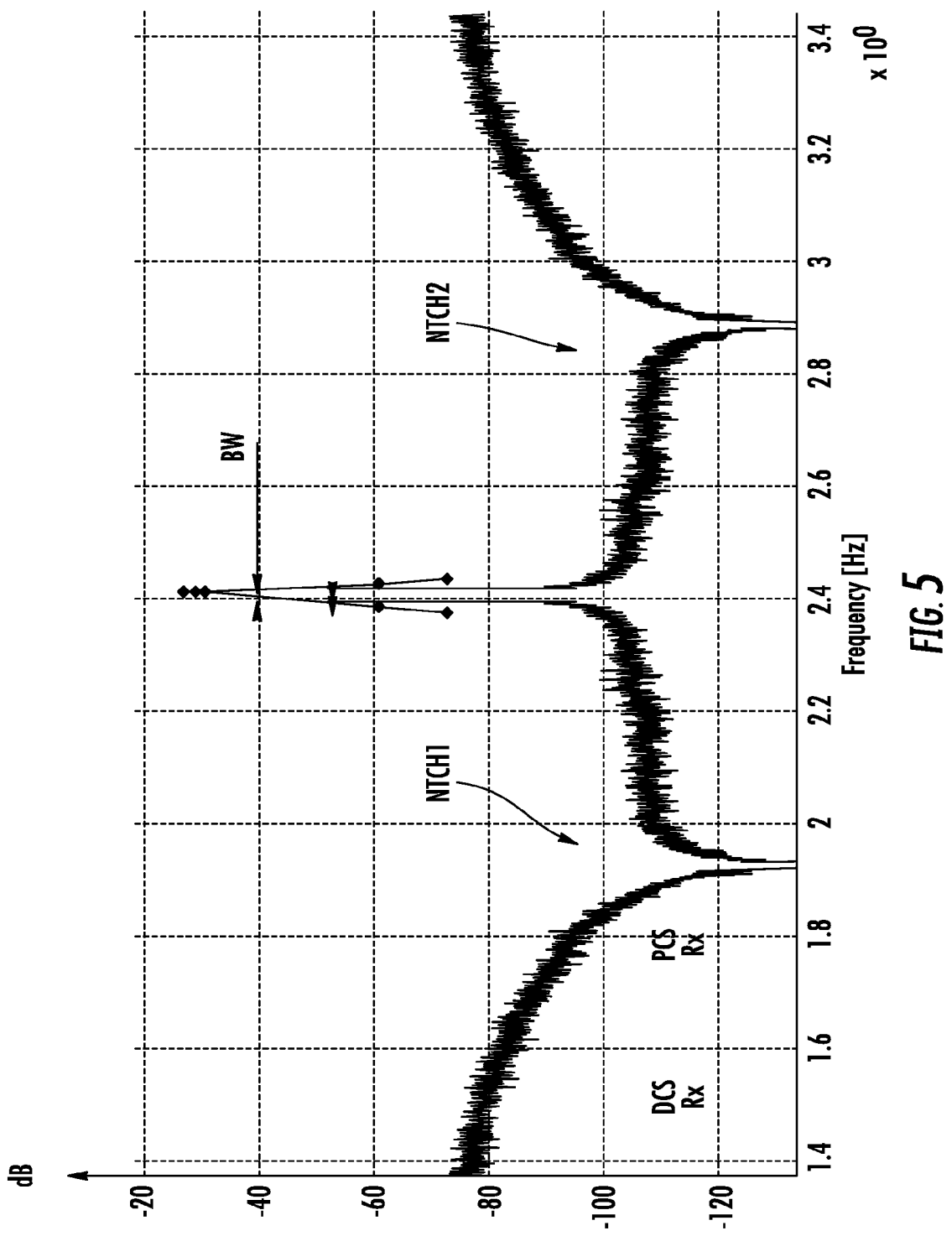
FIG. 5 illustrates two notches resulting from the notch filter illustrated in FIG. 3.

This can be obtained by adjusting the value of the delay, so that this value is smaller than 1/(30*BW), where BW is the frequency bandwidth of the summed radiofrequency analog signal RF OUT (FIG. 5).

However, this threshold is indicative and the man skilled in the art would be able to adjust it depending on the application.

Figure 6:
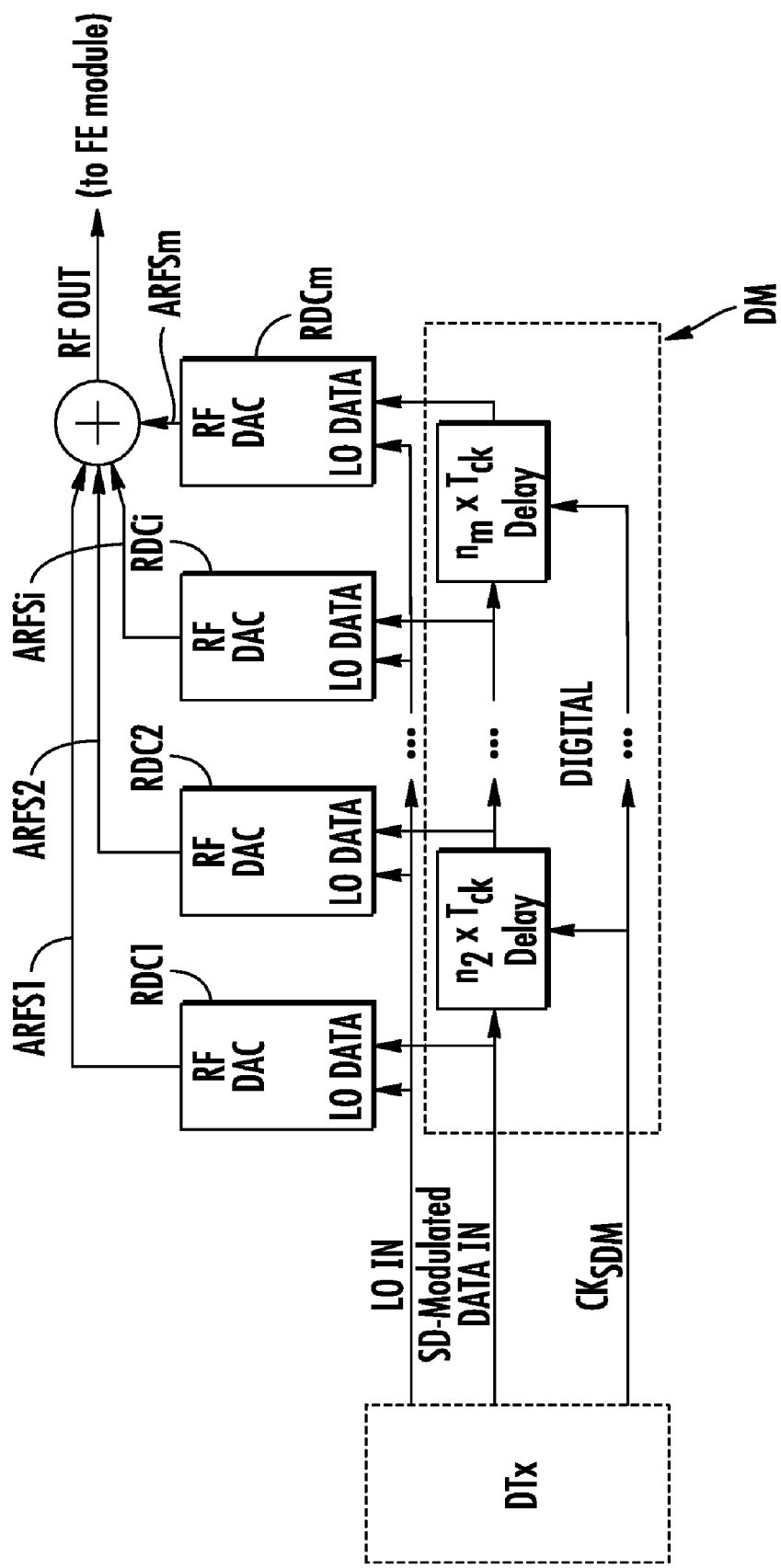
FIGS. 6 to 11 illustrate diagrammatically other examples and embodiments of a device and a method, according to the present invention.

Generally speaking, the notch filter may comprise N radiofrequency digital to analog conversion blocks, N being greater than or equal to 2, and the digital delay means may thus include a chain of N−1 delay blocks respectively connected between the N data inputs of the radiofrequency digital to analog conversion blocks. Such an embodiment is illustrated in FIG. 6, where m RF DAC blocks RDC1-RDCm are illustrated, using delay means DM including a chain of m−1 delay blocks.

Figure 7:
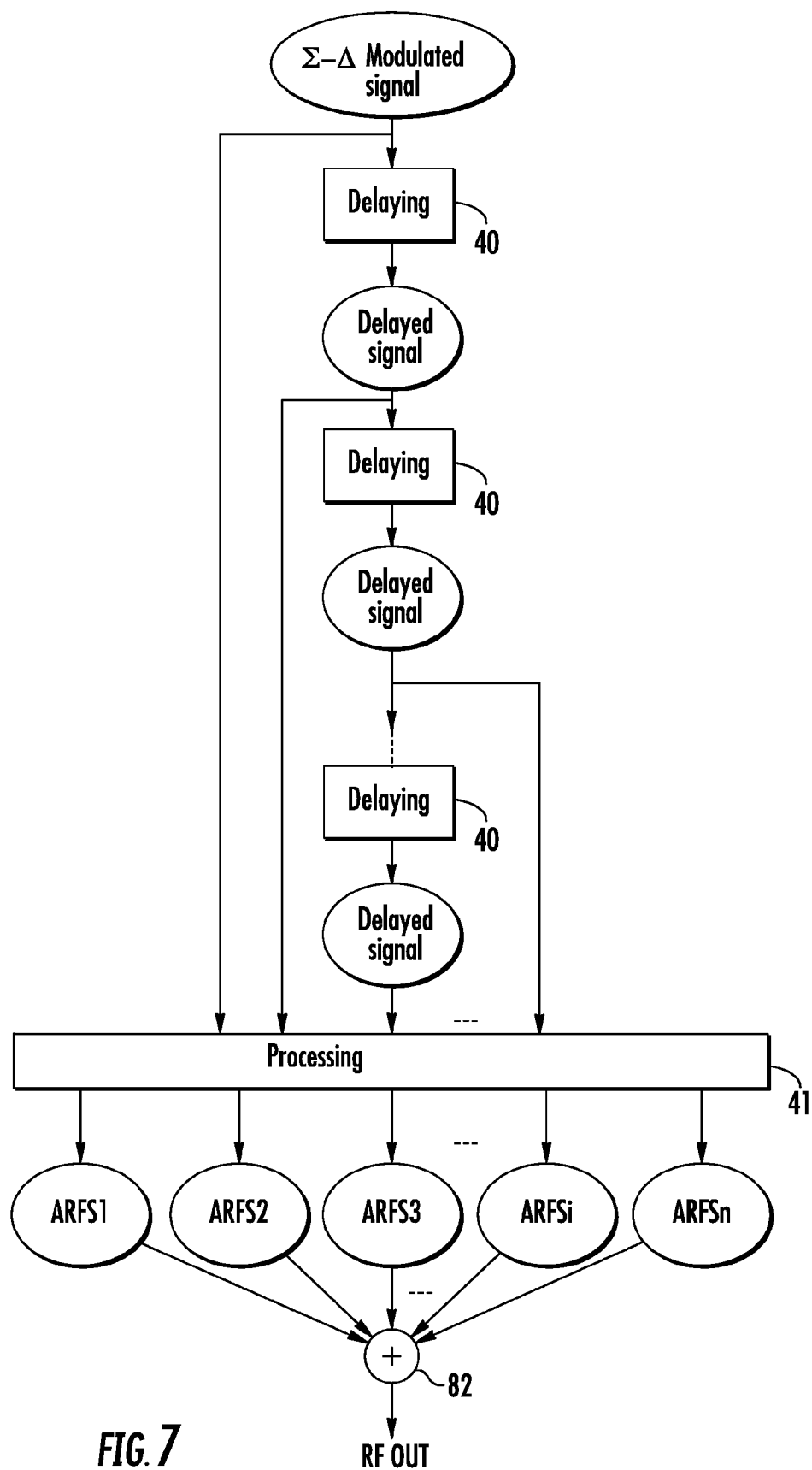

Each RF DAC block RDCi may deliver a radiofrequency analog signal ARFSi. The operation of such an embodiment is illustrated diagrammatically in FIG. 7.

The delta-sigma modulated signal is successively delayed in the delay blocks (step 40) and the delta-sigma modulated signal and delayed signals are processed (step 41) by using a processing as the one illustrated and disclosed in FIG. 4.

Figure 8:
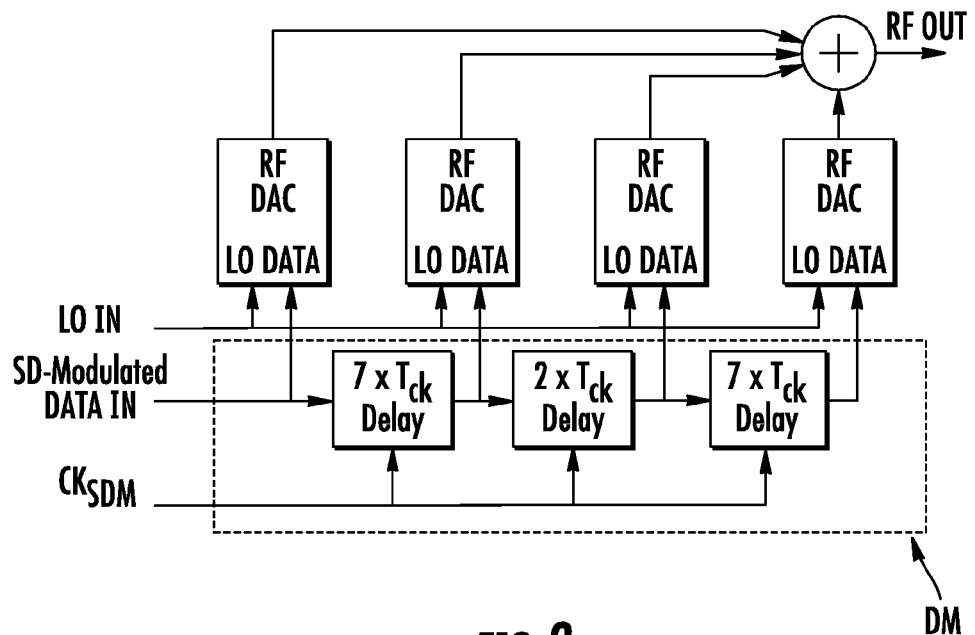
Figure 9:
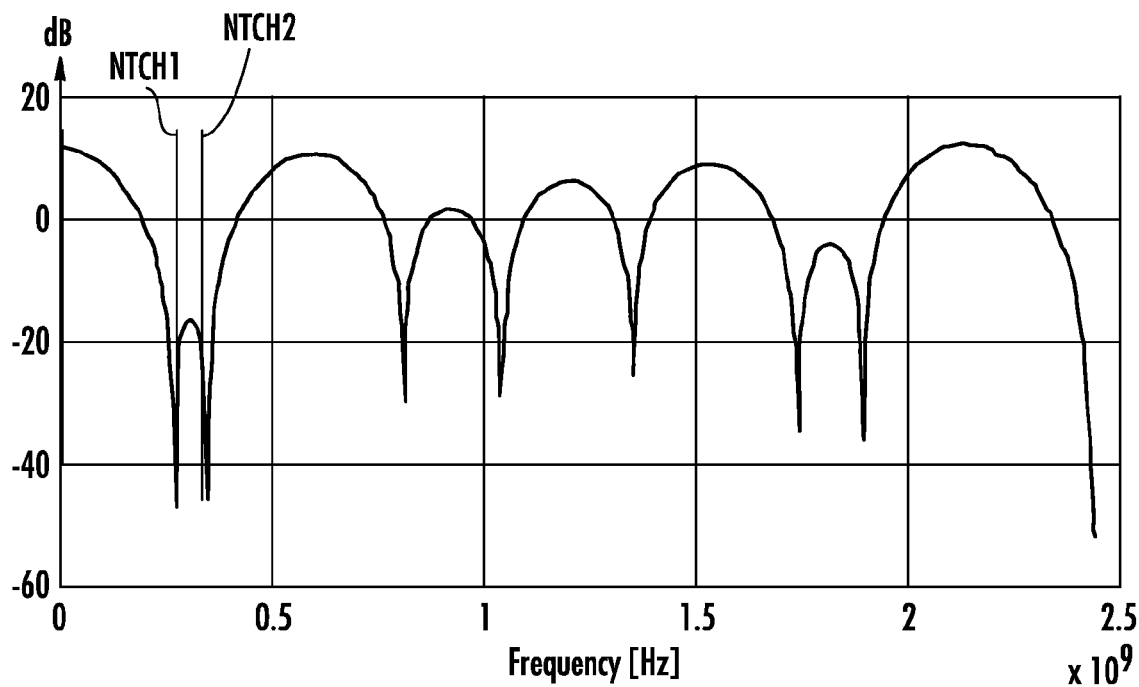

The radiofrequency analog signals ARFSi are summed in the summation means or circuitry (step 82) in order to obtain the summed radiofrequency analog signal RF OUT. An example of such a notch filter is illustrated in FIG. 8, using four RF DAC blocks and three delay blocks having respectively delays values equal to $7T_{ck}$, $2T_{ck}$ and $7T_{ck}$. The filter transfer function of this notch filter in baseband is illustrated in FIG. 9 and comprises two notches NTCH1 and NTCH2 around 280 and 340 MHz, as well as the other notches which are replicas of these two notches.

Figure 10:
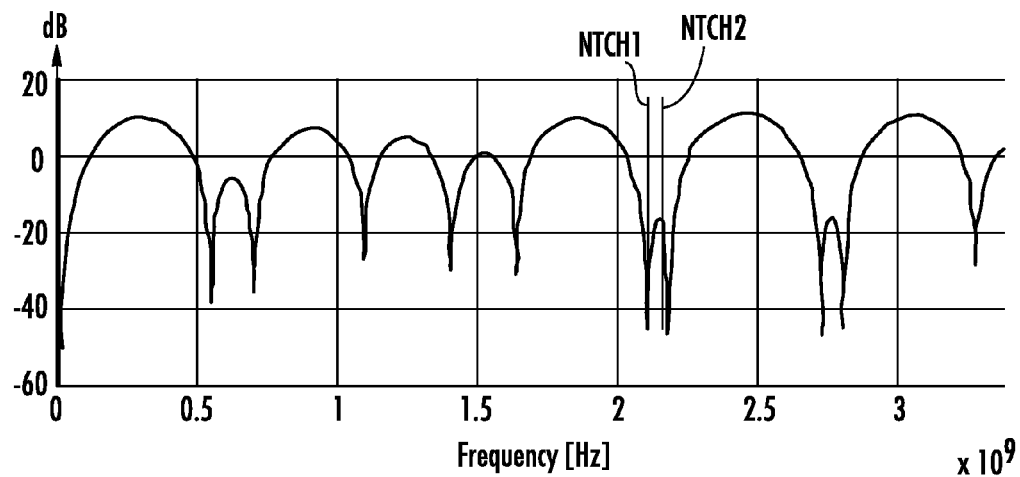
Figure 11:
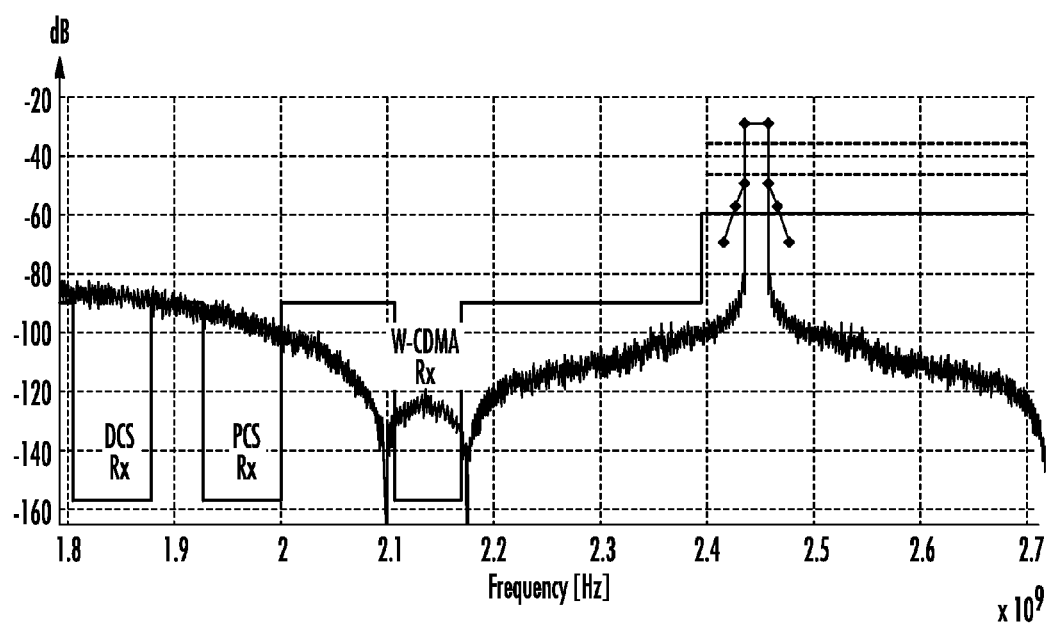

The carrier frequency is equal to 2.45 GHz in this example. The transfer function is transposed around the carrier frequency, as shown in FIG. 10, and the two notches are now placed around 2.1 and 2.2 GHz, i.e. around the WCDMA receiving band (FIG. 11), thus reducing the filter requirements from 70 to 40 dBs in this band. It is also particularly advantageous that the values of the delays may be programmable, so that it is possible to place the notches within the WCODMA receiving band or the PCS receiving band or the DCS receiving band depending on the application.

That which is claimed is:

1. An electronic device comprising:
    a sigma-delta modulator to generate a digital data signal;
    circuitry to generate a radiofrequency (RF) transposition signal;
    a notch filter comprising a plurality of digital to analog converters (DACs), each having
        a first input to receive a signal based upon the digital data signal,
        a second input to receive the RF transposition signal, and
        an output to output an analog RF signal;
    digital delay circuitry comprising a respective delay block coupled between first inputs of successive pairs of said plurality of DACs so that said notch filter has notches related to a delay value of each delay block; and
    a summer to sum the analog RF signals output by said plurality of DACs.

2. An electronic device according to claim 1, wherein said sigma-delta modulator also generates a clock signal; and wherein said digital delay circuitry is controlled by the clock signal.

3. An electronic device according to claim 1, wherein said plurality of DACs comprise N identical digital to analog conversion blocks;
    and wherein said digital delay circuitry comprises a chain of N−1 delay blocks coupled between said first inputs of successive pairs of N identical digital to analog conversion blocks.

4. An electronic device according to claim 1, wherein a delay value of said delay block is less than 1/(30*BW), BW being a bandwidth of the analog RF signal.

5. An electronic device according to claim 1, wherein said digital delay circuitry comprises programmable digital delay circuitry.

6. An electronic device according to claim 1, realized within an integrated circuit.

7. An electronic device according to claim 1, wherein said sigma-delta modulator circuit, said circuitry to generate a radiofrequency transposition signal, said notch filter, said digital delay circuitry, and said summer define a wireless apparatus.

8. An integrated circuit comprising:
    a sigma-delta modulator to generate a clock signal and a digital data signal;
    circuitry to generate a radiofrequency (RF) transposition signal;
    a notch filter having a plurality of digital to analog converters (DACs), each having
        a first input to receive a signal based upon the digital data signal,
        a second input to receive the RF transposition signal, and
        an output to output an analog RF signal;
    programmable digital delay circuitry controlled by the clock signal and comprising a respective delay block coupled between first inputs of successive pairs of said plurality of DACs so that said notch filter has notches related to a delay value of each delay block; and
    a summer to sum the analog RF signals output by said plurality of DACs.

9. An integrated circuit according to claim 8, wherein said plurality of DACs comprise N identical digital to analog conversion blocks;
    and wherein said digital delay circuitry comprises a chain of N−1 delay blocks coupled between said first inputs of successive pairs of N identical digital to analog conversion blocks.

10. An integrated circuit according to claim 8, wherein a delay value of said delay block is less than $1/(30*BW)$, BW being a bandwidth of the analog RF signal.

11. A method for notch filtering a digital signal with a notch filter having a notch frequency based upon a delay value, delivered by sigma-delta modulation circuitry, the method comprising:

delaying the digital signal, by the delay value, using a clock signal to obtain at least one delayed digital signal;

processing the digital signal and the delayed digital signal using radiofrequency (RF) transposition circuitry and a plurality of digital to analog converters (DACs) to obtain a plurality of analog RF signals; and summing the plurality of analog RF signals.

12. A method according to claim 11, wherein delaying the digital signal comprises delaying the digital signal with a plurality of delay values to obtain a plurality of different delayed digital signals; and wherein processing the digital signal and the delayed digital signal comprises processing the digital signal and the plurality of different delayed digital signals identically using RF transposition circuitry and a plurality of DACs to obtain a plurality of analog RF signals.

13. A method according to claim 11, wherein the delay value comprises a programmable delay value.

* * * * *